United States Patent
Noble

(10) Patent No.: US 6,909,051 B2
(45) Date of Patent: Jun. 21, 2005

(54) METHOD AND APPARATUS FOR COUPLING A CIRCUIT BOARD TO A TRANSMISSION LINE THAT INCLUDES A HEAT SENSITIVE DIELECTRIC

(75) Inventor: Robert Henry Noble, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 294 days.

(21) Appl. No.: 10/107,972

(22) Filed: Mar. 27, 2002

(65) Prior Publication Data

US 2002/0134583 A1 Sep. 26, 2002

Related U.S. Application Data

(60) Division of application No. 09/656,741, filed on Sep. 7, 2000, now Pat. No. 6,442,832, which is a continuation-in-part of application No. 09/299,971, filed on Apr. 26, 1999, now abandoned.

(51) Int. Cl.[7] ................................................. H05K 1/09
(52) U.S. Cl. ..................... 174/251; 174/261; 174/262; 439/83
(58) Field of Search ............................... 174/251, 260, 174/261, 84 C, 262–266; 29/843, 860, 861; 439/83

(56) References Cited

U.S. PATENT DOCUMENTS

| | | | | | |
|---|---|---|---|---|---|
| 2,600,012 A | * | 6/1952 | Macy | .......................... | 439/877 |
| 3,955,044 A | * | 5/1976 | Hoffman et al. | ........... | 174/84 C |
| 5,060,373 A | * | 10/1991 | Machura et al. | ............... | 29/858 |
| 5,772,454 A | * | 6/1998 | Long, Jr. | ...................... | 439/83 |
| 5,806,179 A | * | 9/1998 | Hassanzadeh | ................ | 29/860 |

* cited by examiner

*Primary Examiner*—Randy W. Gibson
*Assistant Examiner*—Jeremy Norris

(57) ABSTRACT

A preferred method for coupling a transmission line to a circuit board includes the steps of: providing a circuit board with a first side and an opposing second side; dispensing solder upon the first side of the circuit board; providing a first coupler having a conductive lead portion and a ductile conductive tube portion extending from the conductive lead portion; engaging the conductive lead portion with the solder dispensed upon the first side of the circuit board; heating the circuit board, the solder and the conductive lead portion so that the solder reflows, thereby securing the first coupler to the first side of the circuit board; inserting an extremity of the first conductor into the ductile conductive tube portion; and crimping the ductile conductive tube portion so as to provide crimped retention of the first conductor therein. Circuit boards, devices and systems also are provided.

18 Claims, 10 Drawing Sheets

Fig. 1A          Fig. 1B

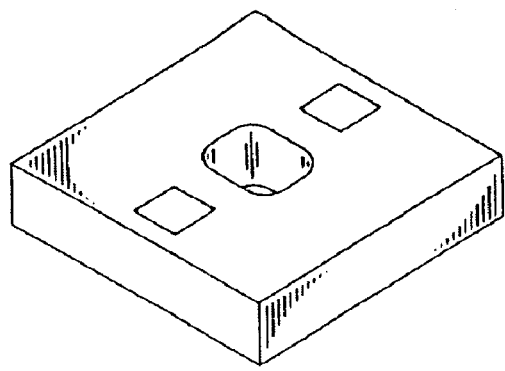
Fig. 8A
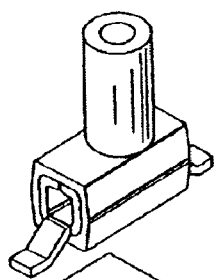
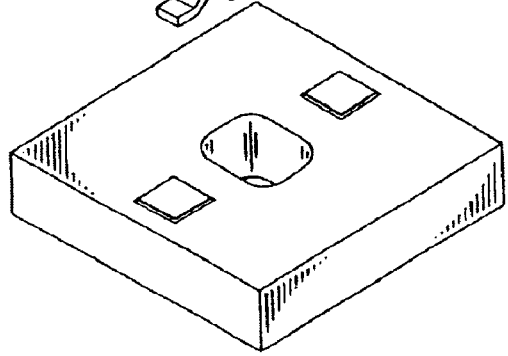
Fig. 8B
Fig. 8C
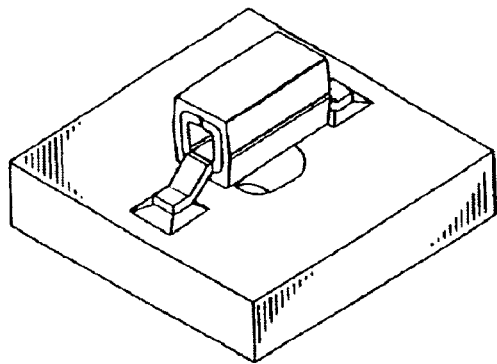
Fig. 8D

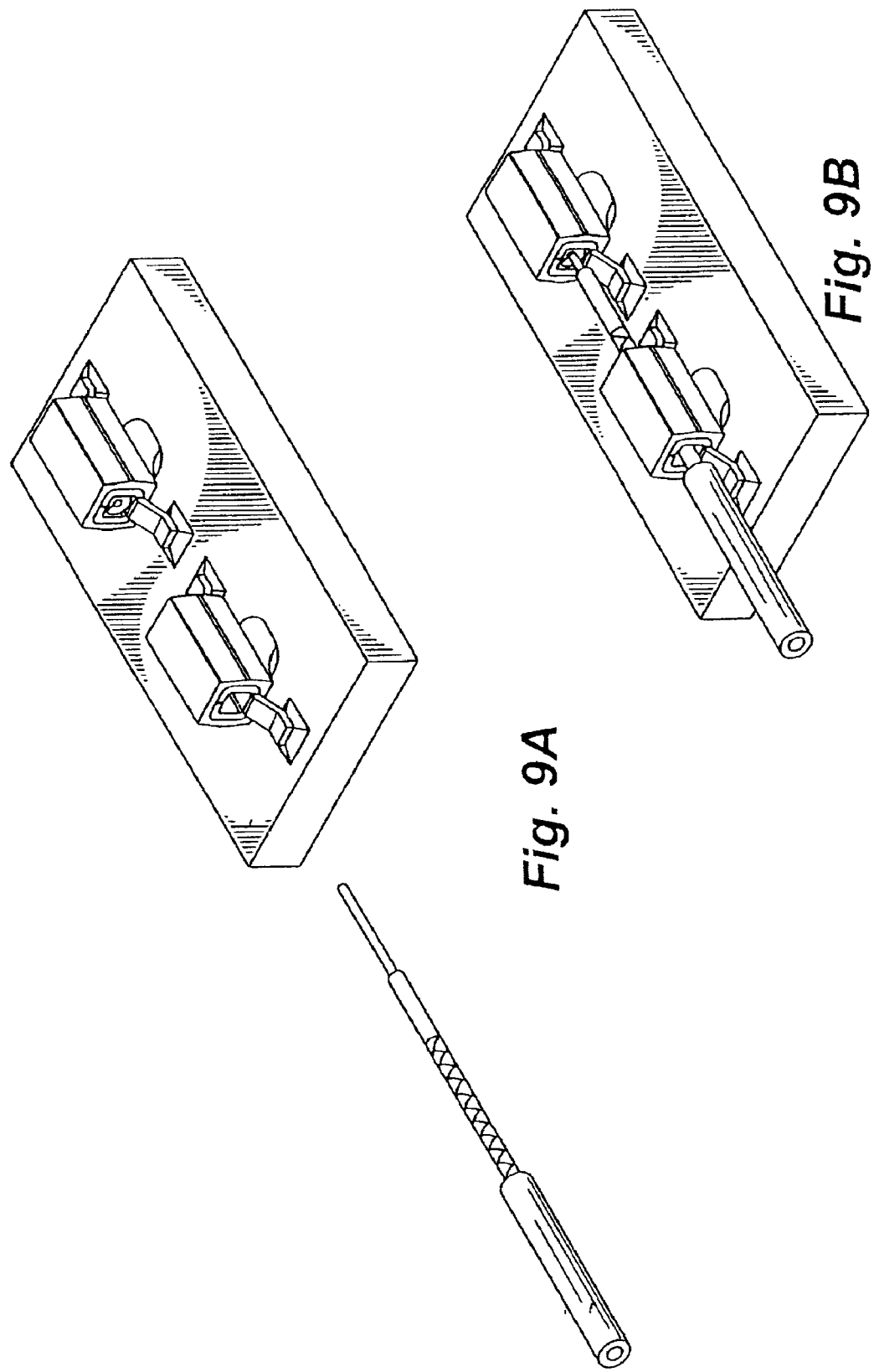

METHOD AND APPARATUS FOR COUPLING A CIRCUIT BOARD TO A TRANSMISSION LINE THAT INCLUDES A HEAT SENSITIVE DIELECTRIC

CROSS-REFERENCE TO RELATED APPLICATIONS

This application is a divisional application, which claims the benefit of and priority to U.S. patent application Ser. No. 09/656,741, filed on Sep. 7, 2000, now U.S. Pat. 6,442,832 issued on Sep. 3, 2002, which is a Continuation-In-Part that claims the benefit of and priority to U.S. patent application Ser. No. 09/299,971, filed on Apr. 26, 1999, now abandoned, both of which are incorporated by reference herein.

BACKGROUND OF THE INVENTION

1. Field of the Invention

The invention is generally directed to assemblies for transmission lines that include a heat sensitive dielectric, and is more particularly directed to methods and apparatuses for coupling transmission lines to circuit boards.

2. Description of the Related Art

Various schemes for coupling transmission lines to circuit board assemblies are known in the prior art. Many of such prior art schemes fall into one of three basic categories:

1. In well known connector type schemes, various connectors for use at high frequency (defined herein substantially within a range from approximately one Mega-Hertz to approximately five Giga-Hertz, so as to also include ultra-high frequency), for example BNC, SMA, SMB, TNC, MCX, MMCX, N, F, UHF and Mini UHF type connectors, well known in the art, are employed. For the connector scheme, the transmission line is coupled to half of the connector system, another half of the connector system is soldered to the printed circuit board, and then both halves of the connector are mated to provide electrical connection.

2. In a manual direct soldering scheme, the transmission line is soldered directly (usually by hand) to plated areas (pads or vias) in the printed circuit board.

3. In an automated direct soldering scheme, conductors of the transmission line and their corresponding mating pads on the printed circuit board are each tinned or provided with a supply of solder, usually in the form of solder paste. The conductors of the transmission line are held in place on their mating pads with fixturing, while a heat source (anvil, hot air, or LASER) is used to reflow the joints.

Advantages of the first scheme are primarily limited to those situations where multiple cycles of connecting and disconnecting the transmission line from the circuit board are needed. However, in many cases only the connection is needed. Disconnection isn't needed or desired. Disadvantages of the connector scheme include the complexity, unreliability, ohmic signal loss, cost and size of the mating connector. For extremely small printed circuit board assemblies, large connectors are particularly undesirable. For example, with extremely small circuit boards (such as those on the order of approximately a half an inch square) used in oscilloscope probe assemblies, the size of a connector may rival or exceed that of the circuit board.

The second scheme of manual direct soldering provides advantageous low ohmic signal loss. The disadvantages of this scheme include the time consuming, expensive manual labor, and further include undesirable variability of hand soldered connections. Also, it is usually necessary, when working with a multistranded conductor of a transmission line, for example an outer braid conductor of a coaxial cable, to prepare an extremity of the multistranded conductor with twisting and/or tinning to keep the individual strands from unraveling. These processes are usually done by hand, and suffer from the same variability and time consuming aspects as any other hand operation. Additionally, care must be used in hand soldering when the transmission line includes heat sensitive dielectric.

The third scheme is an attempt to automate the manual direct soldering of the second scheme. Process variables and difficulties in holding conductors of the transmission lines in place make this scheme only slightly better than hand soldering. When the transmission line includes heat sensitive dielectric, care must be used with the heat source (anvil, hot air, or LASER) used to reflow the joints.

The heat sensitive dielectric, as defined herein, is one that may be substantially deformed or otherwise damaged if exposed to excessive heat during the soldering. Such deformation or other damage caused by such excessive heat may interfere with insulation, for example, the dielectric insulating a first conductor of the transmission line from an additional conductor of the transmission line, resulting in a short circuit. Alternatively, such deformation or damage of the heat sensitive dielectric may introduce a lesser electrical discontinuity for high frequency signals, that still substantially interferes with signal integrity.

Examples of such heat sensitive dielectrics are included in the following table. In the table, following each name is a respective approximate maximum service temperature. The approximate maximum service temperature is a recommended temperature that the particular dielectric material can withstand. At a substantially higher temperature, deformation, melting, or even scorching of the dielectric may take place. Of course, there is variation in these temperatures based on factors such as particular formulations. However the temperatures summarized in the table are generally considered to be fairly representative in the literature, such as plastics encyclopedias.

It should be particularly noted that all temperatures for the examples of heat sensitive dielectrics in the table are well below that a melting point of a typical solder (for example a eutectic solder having a composition of 63% Tin (Sn) and 37% Lead (Pb) has a melting point of three-hundred and sixty-one degrees Fahrenheit (361 F).) Accordingly, it should be understood that excessive heat of soldering poses a real and substantial threat to integrity of heat sensitive dielectrics.

Examples of Heat Sensitive Dielectrics

| Name of Material | Approximate Maximum Service Temp. |
| --- | --- |
| Polyethylene | 175 to 230 degrees Fahrenheit (varies with density) |
| Polyethylene (cellular) | 160 degrees Fahrenheit |
| Polypropylene | 230 degrees Fahrenheit |
| Polyvinyl Chloride | 140 to 220 degrees Fahrenheit (varies with density) |
| Polystyrene (expanded) | 175 degrees Fahrenheit |
| Chlorinated Polyether | 250–275 degrees Fahrenheit (varies with density) |
| Chlorinated Polyvinyl Chloride | 210 degrees Fahrenheit |
| Polysulfones | 340 degrees Fahrenheit |
| Ethylene Vinyl Acetate | 147 degrees Fahrenheit |

While the schemes of the prior art discussed previously herein provide some advantages, some challenges still remain, particularly for transmission lines and circuit boards used in extremely small probing arrangements for oscilloscope systems, and the like. For such systems, there is a need to make finished probe tip assemblies which are small enough that their weight does not bend or break extremely delicate leads of fine-pitch (and extra-fine-pitch) surface mount integrated circuit packages. Also, their size must be reduced so that probe assemblies can be placed side-by-side in little space to probe multiple closely spaced circuits. The most common scheme for terminating transmission lines in this type of assembly is hand soldering. Trouble with inconsistencies in hand soldering led to a search for other termination schemes. After considerable research, it was found that conventional hand soldering had the best probability of success, despite its shortcomings. So-called "microminiature" connectors were much too large, while hot-anvil or LASER reflow systems were extremely process-dependent and would rely on manual alignment of transmission lines, with little improvement over hand soldering in terms of consistency.

Accordingly, there is a need for improved systems and methods which address these and other shortcomings of the prior art.

SUMMARY OF THE INVENTION

Briefly described, the present invention generally relates to devices, systems and methods for coupling transmission lines to circuit boards. As the present invention may be construed as providing a method for coupling a transmission line to a circuit board, with the transmission line including a heat sensitive dielectric and at least a first conductor, a preferred embodiment of such a method includes the steps of: providing a circuit board having a first side and an opposing second side; dispensing solder upon the first side of the circuit board; providing a first coupler having a conductive lead portion and a ductile conductive tube portion extending from the conductive lead portion; engaging the conductive lead portion with the solder dispensed upon the first side of the circuit board; heating the circuit board, solder and the conductive lead portion such that the solder reflows, thereby securing the first coupler to the first side of the circuit board; inserting an extremity of the first conductor into the ductile conductive tube portion; and crimping the ductile conductive tube portion so as to provide crimped retention of the first conductor therein.

Other embodiments of the present invention may be construed as providing circuit boards. In a preferred embodiment, the circuit board includes a substrate with a first side and an opposing second side and solder applied in a land pattern to the first side of the substrate. The circuit board also includes a first coupler engaging the first side of the circuit board that is secured thereto by the solder. The first coupler incorporates a first conductive lead portion and a first ductile conductive tube portion extending from the first conductive lead portion. Additionally, a first transmission line is provided which includes a first conductor and heat sensitive dielectric engaged about at least a portion thereof, with an extremity of the first conductor being engaged in crimped retention within the first ductile conductive tube portion.

An alternative embodiment of the circuit board includes substrate with a first side and an opposing second side and solder applied in a land pattern to the first side of the substrate. A first transmission line is provided which includes a first conductor and heat sensitive dielectric engaged about at least a portion thereof. Additionally, means for engaging an extremity of the first conductor in crimped retention is provided so that the transmission line may be coupled to the circuit board.

Other embodiments of the present invention may be construed as providing systems for coupling a transmission line to a circuit board. In a preferred embodiment, the system includes a circuit board, a solder dispenser configured to dispense solder upon a first side of the circuit board, and a first coupler. Automated pick-and-place equipment is configured to extract the first coupler from a presentation and engage the conductive lead portion of the first coupler with the solder dispensed upon the circuit board. A reflow heater assembly is provided, which is configured for receiving the circuit board, solder and the conductive lead portion from the automated pick-and-place equipment and heating the circuit board, solder and the conductive lead portion so that the solder paste reflows, thereby securing the first coupler to the first side of the circuit board. Additionally, crimping equipment is provided for receiving the circuit board with the first conductor inserted into the ductile conductive tube portion and for crimping the ductile conductive tube portion so as to provide crimped retention of the first conductor therein.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

FIGS. 1A–1E depict various views of a preferred embodiment of the invention.

FIGS. 8A–8H are schematic diagrams depicting representative utilization of a preferred embodiment of the invention.

FIGS. 9A–9D are schematic diagrams depicting representative utilization of another preferred embodiment of the invention.

DETAILED DESCRIPTION OF THE PREFERRED EMBODIMENT

Figure 1C:
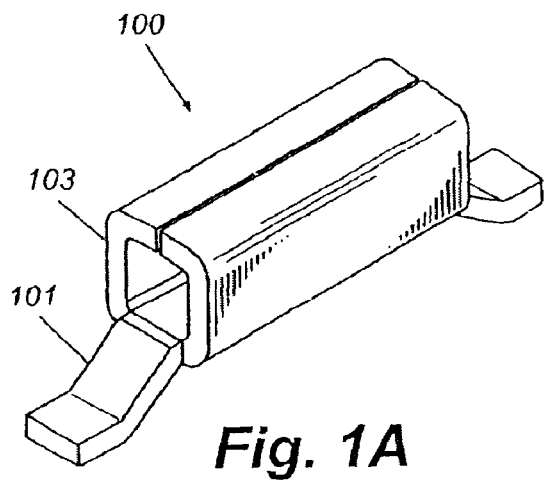
Figure 1C:
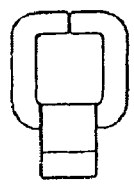
Figure 1C:
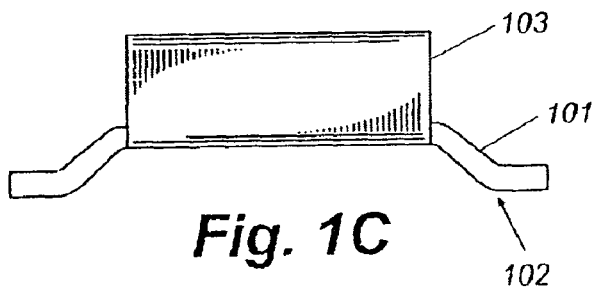

Reference will now be made in detail to the description of the invention as illustrated in the drawings with like numerals indicating like parts throughout the several views. FIGS. 1A–1E show various views of a preferred embodiment of the invention. As shown in these figures, a preferred embodiment of a transmission media connector or coupler 100 of the present invention includes at least one conductive lead portion 101 having a surface 102 adapted for soldering to a circuit board. In the preferred embodiment, shown in FIGS. 1A–1E, two opposing, so called "gull-wing", leads are provided for surface mount technology ("SMT") soldering and assembly. Although gullwing leads are shown in the figures, it should be understood that the invention is not limited to this lead configuration, since other lead configurations may be employed in conjunction with the principles of the invention with beneficial results. For example, and not for the purpose of limitation, so called "J-leads" may be advantageously employed for SMT soldering and assembly.

While both gull-wing and J-lead configurations have their respective benefits, the gull-wing configuration is preferable for two reasons. First, the gull-wing configuration advantageously provides for a greater distance between locations where the leads contact solder pads of the circuit board, which in turn provides more space for an aperture in the circuit board located therebetween (wherein the aperture is used in assembly for tooling access, as discussed in further detail subsequently herein). Second, with the gull-wing configuration, each of two opposing sides of sheet stock used in fabrication of the lead is optimally plated and textured in a different respective manner, based on intended function; specifically one side of the sheet stock is plated and textured within a manner selected for the function of coupling with the conductor of the transmission line, and the other (opposing) side is plated with and textured in a manner selected for coupling with the solder pads. This allows each side of the sheet stock to be plated and textured optimally for its intended use, without resorting more complexly selective plating and texturing. Since various beneficial methods for such plating and texturing (for such intended functions) are well known in the art, they are not discussed in further detail herein. As another alternative, both gull-wing and J-leads, there may be employed lead configurations adapted for use with printed circuit board vias and through-hole wave soldering techniques.

Figure 1D:
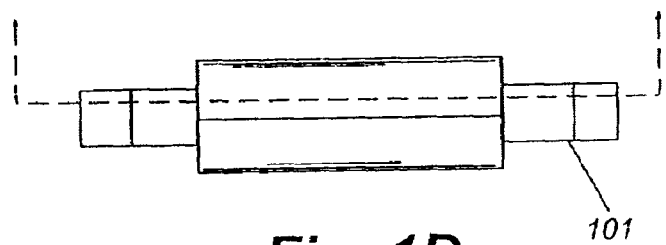
Figure 1E:
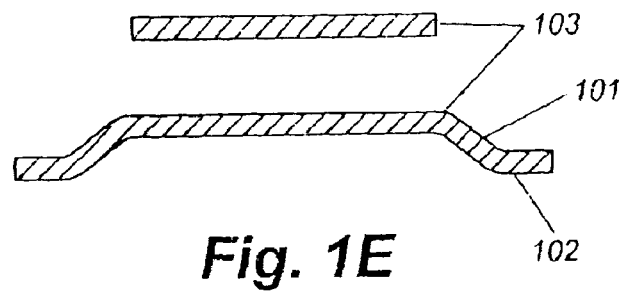

The isometric view of FIG. 1A also shows a ductile conductive tube portion 103 extending from the lead portion 101 for receiving insertion of an extremity of a conductor of a transmission line, after the lead portion is soldered to the circuit board. As shown in FIGS. 1A–1E, preferably the tube portion and the lead portion are integrally fashioned from bending a single piece of conductive and ductile metal sheet stock. As shown, FIG. 1A provides an isometric view; FIG. 1B provides an end view; FIG. 1C provides a side view; FIG 1D provides a top view; and FIG. 1E provides a cross-sectional view along an axis shown in FIG. 1D.

Figure 2A:
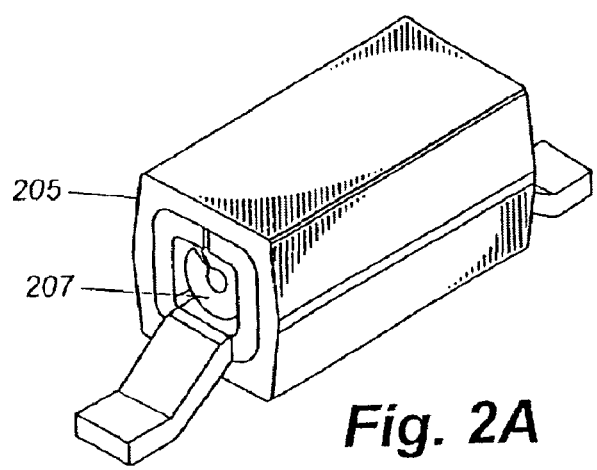
FIGS. 2A–2E depict various views of another preferred embodiment of the invention.
Figure 2B:
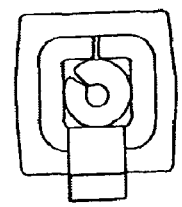
Figure 2C:
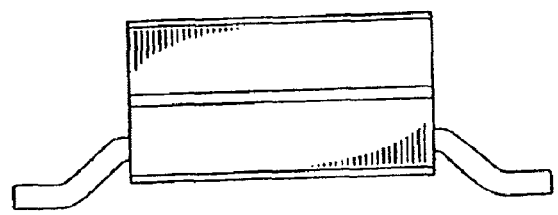
Figure 2D:
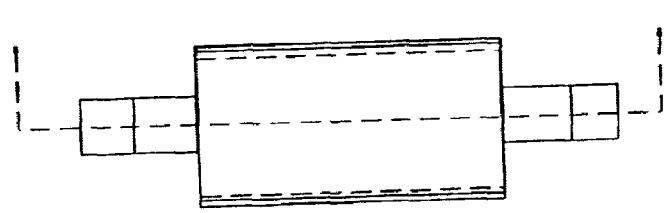
Figure 2E:
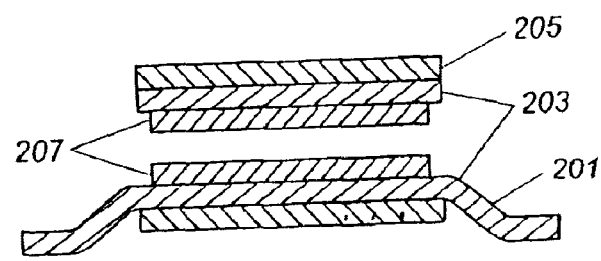

FIGS. 2A–2E show various views of another preferred embodiment of the invention. As shown, FIG. 2A provides an isometric view; FIG. 2B provides an end view; FIG. 2C provides a side view; FIG. 2D provides a top view; and FIG. 2E provides a cross-sectional view along an axis shown in FIG. 2D.

FIGS. 2A–2E show lead portion 203 and lead portion 201, which are similar to that shown and discussed previously with respect to FIGS. 1A–1E. However, additional enhancements are also shown in FIGS. 2A–2E: for example, a jacket (preferably an overmold or sleeve of polyether sulphone or Poly p-phenylene sulphide (PPS) type of plastic, for example) is coupled with the tube for color coded and automated identification, and for optimization of a pick-up surface for automated pick and place assembly and manufacturing equipment.

The jacket has dimensions selected so as to aid in use of automated pick-and-place equipment in conjunction therewith. For example, it is preferable that the jacket have dimensions selected to provide a preferred exterior pick-up surface of at least approximately a millimeter square, or larger.

Similarly, the jacket is selected to have a sufficient coloring so as to aid in identification in assembly. For example yellow, blue and red colorings are preferred for these purposes; however, the invention is not strictly limited to such colors, since other colors can be used with beneficial results.

Preferably, the jacket is made from non-conductive materials, allowing the invention to be used in tight spaces without the jacket causing short circuits to, for example, a metal chassis. The material used for the jacket is selected to be able to withstand (to some extent) the heat of soldering the lead. However, a limited amount of deformation or other change in properties of the jacket from the heat of soldering is permissible, since the jacket is not needed for any significant structural function after soldering.

Additional enhancements are also shown in FIGS. 2A–2E. It should be understood that in some preferred embodiments of the invention, the tube portion has an inner diameter sufficiently small so as to provide for crimped retention of the first conductor when the first conductor has a diameter substantially within a range from approximately twenty-six American wire gauge (26 AWG) to fifty-six American wire gauge (56 AWG). However, the use of a ductile conductive collar accommodates various sizes of the conductor of the transmission line that are substantially smaller in diameter than that of a standardized embodiment of the tube portion 203, and also provides for any desired plating configurations of the conductive collar that are different from that of the piece of sheet stock used in fabricating the tube and lead portions. Accordingly, use of the conductive collar provides for some customization of the standardized embodiment of the tube and lead portions, resulting in an advantageous reduction in tooling investment. FIGS. 2A–2E show the ductile conductive collar 207 press fit into the tube portion 203 to accept the smaller diameter conductor of the transmission line or a smaller diameter conductor that requires a plating configuration of the collar (which is different from that of the sheet stock used in fabricating the tube and lead portions). Such customization is particularly advantageous in oscilloscope probes, which typically employ a center conductor made of something other than tinned copper.

Figure 3A:
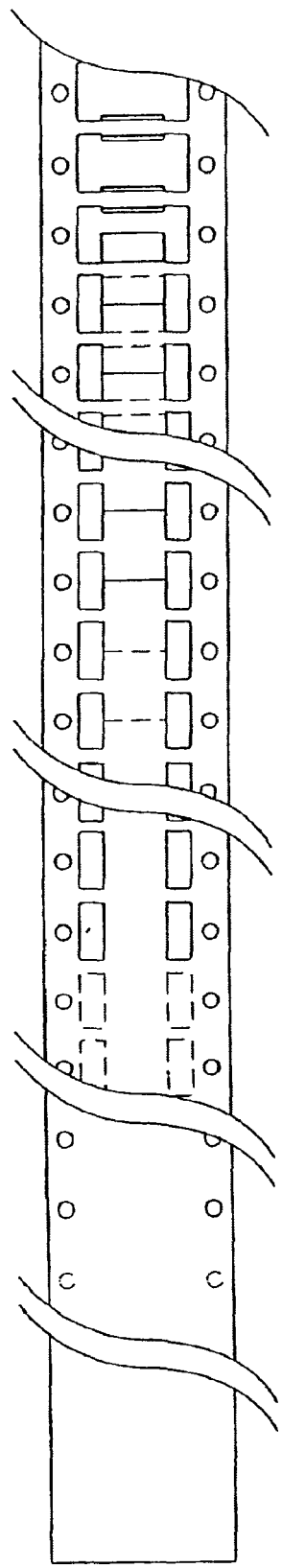
FIGS. 3A and 3B are top views illustrating formation of tube and lead portions of a preferred embodiment formed from sheet stock.
Figure 4A:
FIGS. 4A and 4B are side views of the embodiment depicted in FIGS. 3A and 3B.
Figure 5:
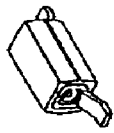
FIG. 5 is an isometric view showing a result of making the tube and lead portions as depicted in FIGS. 3A–3B and 4A–4B.
Figure 3B:
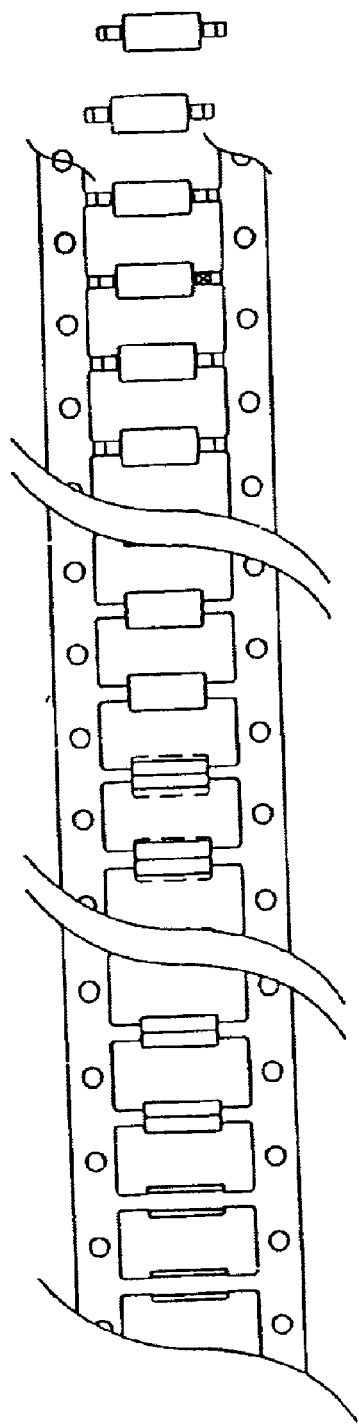
Figure 4B:
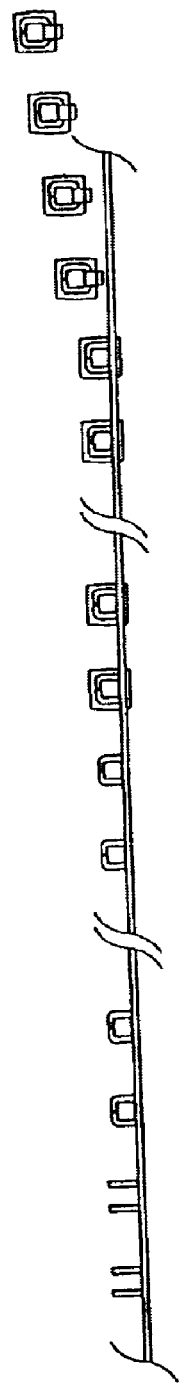

FIGS. 3A and 3B are top views illustrating time sequential steps viewed from left to right of how to make tube and lead portions of the invention from sheet stock. FIGS. 4A and 4B are side views of what is shown in FIGS. 3A and 3B. The figures show a preferred fabrication method for the invention, using progressive-die techniques. Initially, sheet stock is plated and is slit to width, so as to provide a continuous strip as shown in the figures. Indexing holes are added adjacent to edges of the strip. Excess metal is punched out, and cuts between various members occur next, as shown in the figures. Forming of the tube portions for use as crimp cavities takes place in the next two steps. A particular order of these steps is determined during tool development. FIGS. 3B and 4B further show the optional application of an overmolded jacket. If overmolded jacketing is to be done, it is likely that the continuous band would be cut into strips of approximately ten units, as is the case with integrated circuit overmolded jacketing. It is also possible to apply a tubular sleeve, which is subsequently heat molded to its final shape, but this would have to occur after lead form and shear. FIGS. 3B and 4B show a single-step lead forming and shearing process. From here, members would be moved to an automated tape and reel machine for packaging into the tape and reel presentation. FIG. 5 is an isometric view of one of the members, showing a result of making the tube and lead portions as in FIGS. 3A–3B and 4A–4B.

Figure 6:
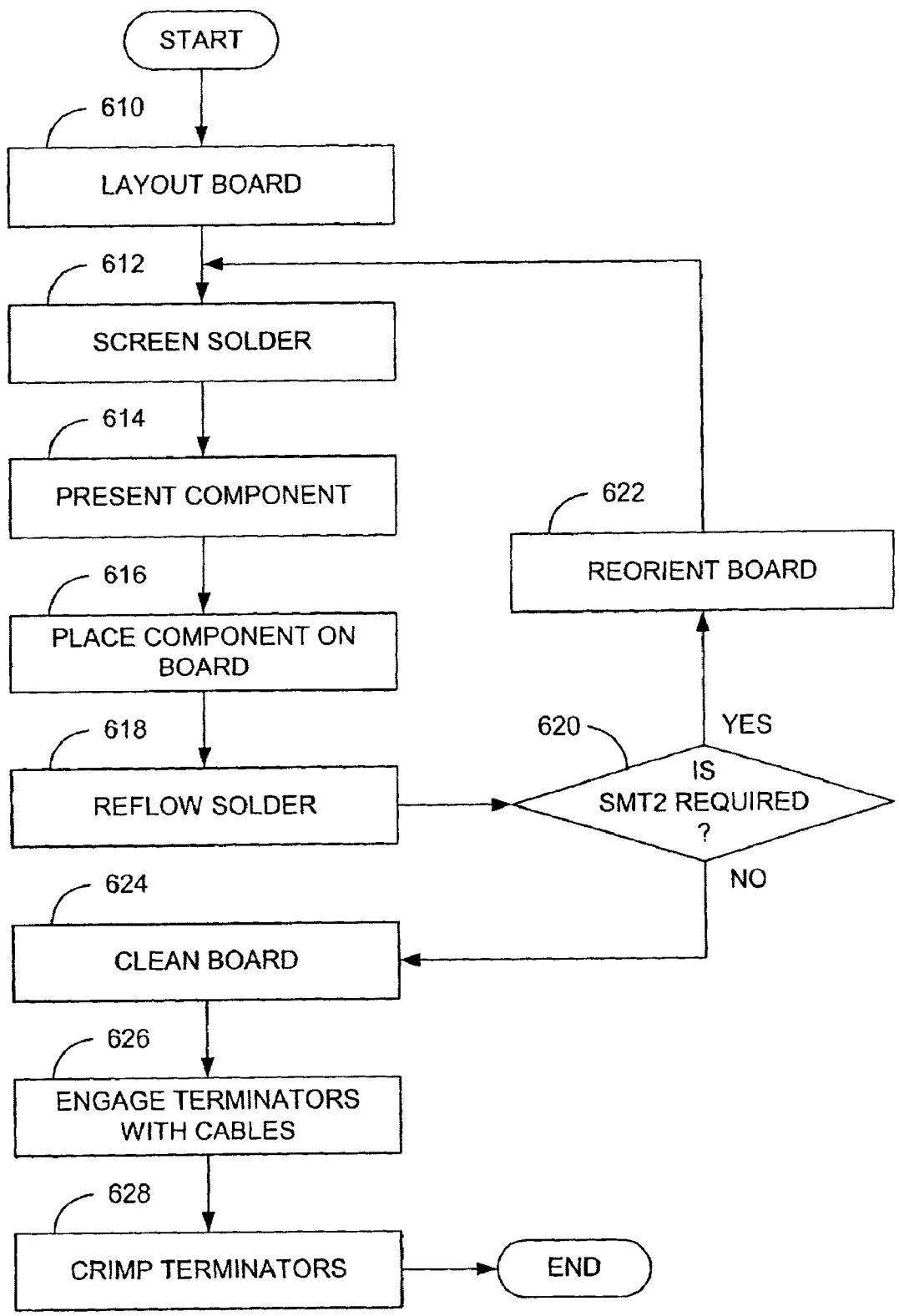
FIG. 6 is a flow chart depicting a representative Surface Mount Technology (SMT) manufacturing process.

Referring now to FIG. 6, a brief description of a representative SMT process will now be provided. As depicted in FIG. 6, the process may be construed as being at block 610 where a circuit board layout is designed. The design of such a board layout typically utilizes land patterns that are adapted to ensure that proper placement and soldering of components to be applied to the board are achieved. Since much time and effort typically is expended during the design of a board layout, the ability to utilize standard SMT land patterns is considered but one advantage offered by utilizing preferred embodiments of the present invention. In particular, some embodiments of the coupler of the present invention are configured for utilizing land patterns corresponding to existing diodes, e.g., SOD 123, SOD 323, among others. Once board layout has been suitably established, the process may proceed to block 612 where solder (with or without added binders) is applied to the board, such as by a solder screening process. In accordance with such a process, solder, e.g., solder paste, is applied to the board so that the solder paste corresponds to the previously determined land patterns. As the solder paste contains solder and flux, as well as binders, utilizing such a solder paste has been found extremely useful for bonding the couplers of the present invention to a circuit board during processing.

After solder screening, the process preferably proceeds to a component presentation step (block 614), where components, e.g., couplers, among others, are provided in a form suitable for placement by automated placement equipment. In a preferred embodiment, the couplers may be provided in, for example, a tape and reel presentation. Proceeding to block 616, components may be placed on the board, such as by pick and place equipment which transfers the various components from their presentation configuration to their intended positions upon the board. As mentioned briefly hereinbefore, when the components engage the solder paste of their respective land patterns, the components are retained in position by the solder paste. Placement of the components upon the board in the aforementioned manner preferably results in the placed components not being bent, contaminated, or otherwise misloaded.

Figure 7:
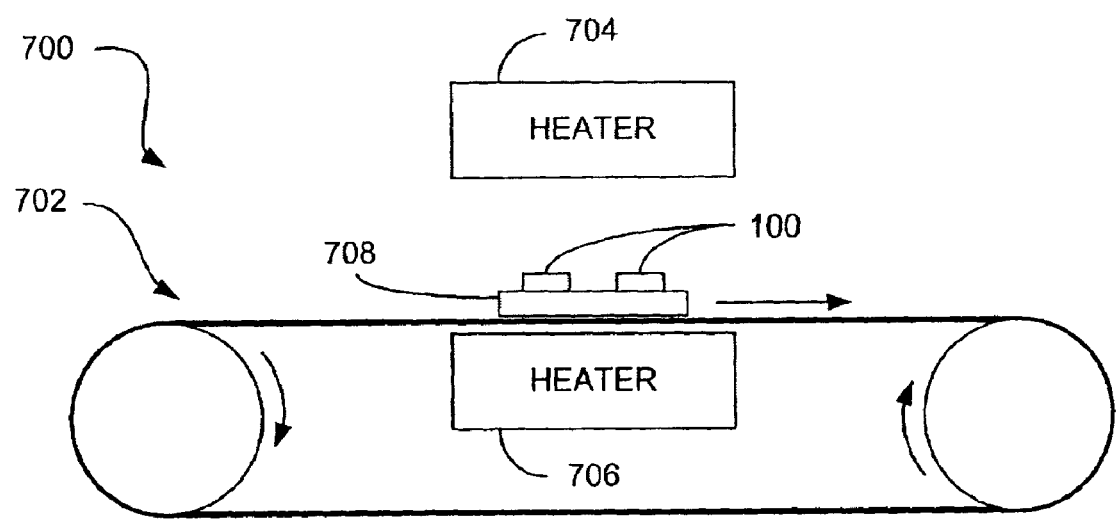
FIG. 7 is a schematic diagram depicting a representative solder reflow system.

Once components are properly placed upon the board, the process may proceed to block 618 where solder reflow is accomplished. Such a solder reflow process typically incorporates the use of an inline reflow system, such as the representative system 700 depicted in FIG. 7. As shown therein, reflow system 700 incorporates a conveyor assembly 702 which cooperates with one or more heaters, e.g., heaters 704 and 706. So provided, the system 700 is configured to receive a circuit board 708, which is then deliverable by the conveyor assembly through the various heaters, so as to increase a temperature of the solder to a reflow temperature. So provided, various components, such as couplers 100, may be suitably affixed by solder to the circuit board. As mentioned briefly hereinbefore, raising the temperature of the solder to a reflow temperature also allows various volatiles, e.g., binders, among others, to diffuse from the solder paste, with such volatiles typically being vented from the reflow system.

The configuration of the couplers of the present invention may be adapted, i.e., adapted as to shape, size, and/or mass, so that surface tension created between the reflowed solder and the corresponding foot of the coupler to be engaged therewith cooperate so as to urge each foot toward the center of it's respective land pattern. As described in detail hereinafter, the surface tension may also be sufficient to hold the foot to the board after the binders have been removed from the solder paste, such as during a heating process, so that, during an SMT2 process, for example, where the board is inverted and the solder reheated to a reflow temperature, the coupler still may be held by the solder to the board. As utilized herein, the "SMT2" refers to preparing both sides of a circuit board by SMT processing so that components may be applied to both sides of the circuit board.

After the reflow soldering operation (block 618), a determination may be made as to whether SMT2 processing is required (block 620). If it is determined that SMT2 processing is required, the process may proceed to block 622 where the circuit board may be reoriented, such as by inverting the board. Thereafter, the process may return to block 612 and proceed as described hereinbefore. If, however, it is determined that SMT2 processing is not required, the process may proceed to block 624 where the board may be cleaned, such as by washing. Thereafter, such as depicted in block 626, couplers of the present invention may be appropriately engaged with cables, e.g., the cables are inserted within the couplers. Then, as depicted in block 628, the couplers may be appropriately crimped, such as by automated or manually operated crimping equipment, thereby providing crimped retention of the cables within the couplers.

Figure 8E:
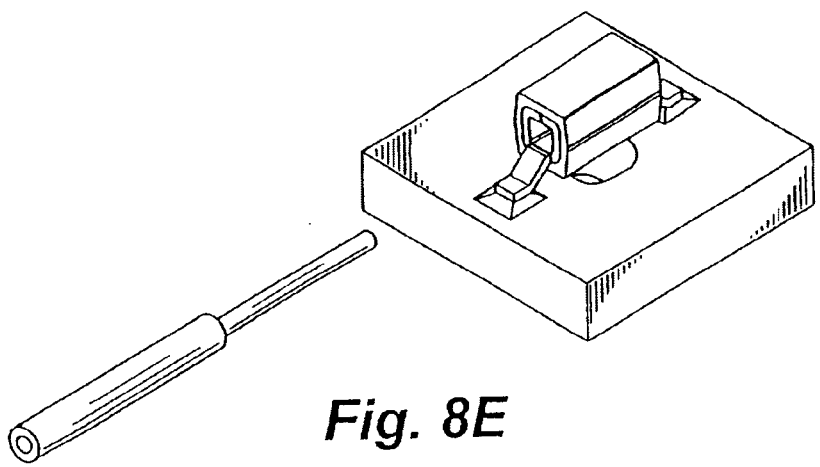

Referring now to FIGS. 8A–8H, a preferred arrangement of the invention will be described. FIG. 8A is a simplified view of an area of a printed circuit board substrate, showing where the leads contact solder pads of the circuit board. An aperture in the circuit board is shown located therebetween (wherein the aperture is used in assembly for tooling access, as discussed in further detail subsequently herein). Solder paste is added to the pads in FIG. 8B by conventional screen or stencil methods.

FIG. 8C shows a very simplified and abbreviated view of a vacuum chuck employed in automated pick-and-place equipment, as it retrieves the jacketed tube portion (and accompanying lead portions) of the preferred embodiment of the invention from a tape and reel carrier (not shown) for suitable placement on the printed circuit board. After placement and reflow soldering, FIG. 8D shows the lead portions securely attached to the pads of the printed circuit board.

Figure 8F:
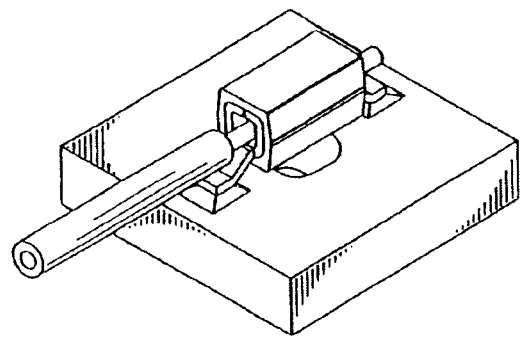

FIGS. 8E and 8F show very simplified and very abbreviated views as a conductor of a transmission line is inserted into the tube portion, such as by automated assembly equipment (not shown), for example. As shown, a sufficient amount of the outer insulating layer of the heat sensitive dielectric is stripped so as to provide an appropriate length of the conductor.

Figure 8H:
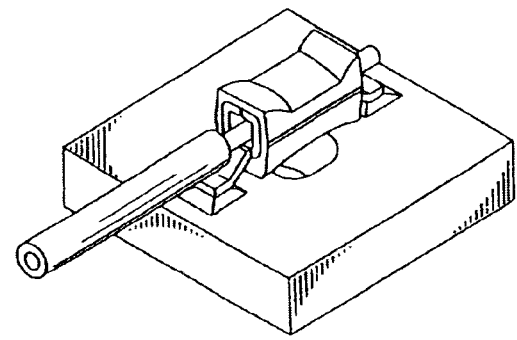
Figure 8G:
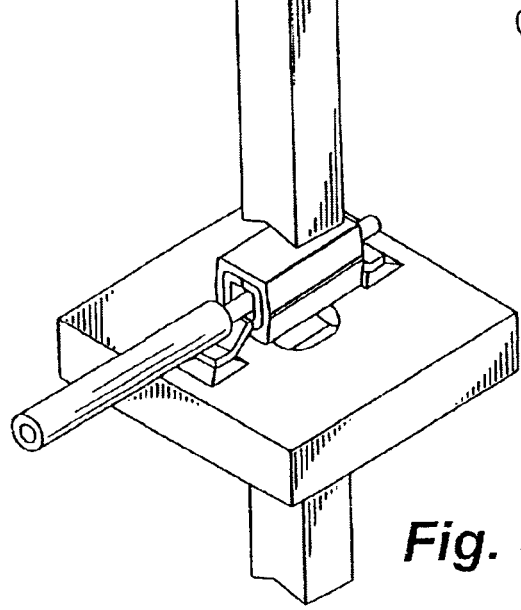

By sequential steps as illustrated in FIGS. 8G and 8H, the ductile conductive tube portion is sufficiently crimped so as to retain the first conductor therein, and to form a low-resistance connection and a gas-tight seal. This mechanically supports and maintains an arrangement of the lead portion, the tube portion and the transmission line, and also provides for efficient transmission of selected high frequency electrical signals between the circuit board and the transmission line through the conductive lead and the conductive tube.

FIG. 8G shows a very simplified and very abbreviated view of an automated set of pincers. As shown, a first member of the set of pincers is inserted through an aperture in the circuit board adjacent to a central region of the tube portion so as to impinge upon the central region of the tube portion. An opposing member of the set of pincers is arranged to impinge upon the central region of the tube portion.

As shown in FIG. 8H, the set of pincers or crimping tools is used to crimp the ductile tube portion to an extent that is sufficiently great to deform the central region of the ductile tube portion for crimped retention of the conductor, and to maintain such deformation after the pincers are released, but wherein the extent is also sufficiently limited so as to avoid substantially interfering with integrity a solder bond of the lead soldered to circuit board. Preferably, the extent is selected to be substantially within a range of approximately forty percent to approximately sixty percent of an inner diameter of the tube portion.

In appreciating the automation benefits of the invention, it should be understood that beneficial results are obtained with only minimal requirements, such as ensuring that the conductor of the transmission line is inserted into the tube portion prior to activating the crimping fixture. Over-insertion can be avoided by selecting the inner diameter of the tube commensurate with the diameter of the conductor of the transmission line (large enough to freely admit the conductor into the tube portion, but too small to admit the outer insulating layer of the heat sensitive dielectric). Under-insertion may be avoided by preparing the conductor such that its stripped length is long enough to allow some transmission line to extend beyond the tube portion (as shown in FIGS. 8F–8G) for automated or visual inspection.

Beneficial results also are obtained in regard to preventing the transmission line(s) from being exposed to the potentially damaging heat associated with soldering, e.g., reflowing the solder, and washing solution utilized during circuit board cleaning. Thus, the potential benefits offered by automated SMT processing are facilitated by utilizing the present invention which tends to reduce the risk of exposing the transmission line(s) of the circuit board to the damaging influences of excessive heat and/or liquids.

Custom fixturing is employed to ensure precise positioning of the transmission line with respect to the tube portion during the crimping process. The crimping pincers should be well aligned to the printed circuit board so as to provide adequate crimping force, while not unduly stressing existing solder joints. Automated, rather than manual control of the crimping force is desirable, so as to provide for consistency in alignment and amount of the crimping force. Additionally, the custom fixturing is advantageously employed to support the transmission line, as well as the printed circuit assembly, during the crimping process.

The preferred arrangement of the crimping pincers advantageously allows for a high density arrangement of adjacent tube portions on the printed circuit board, but requires that apertures be fabricated in the printed circuit board. It should be noted that although the discussions herein have focused on the preferred arrangement of the crimping pincers extending perpendicularly through the aperture in the printed circuit board, a lateral arrangement of the crimping pincers that does not require the aperture may be alternatively employed. However, such lateral crimping does not allow for as high a density arrangement of adjacent tube portions on the printed circuit board as in the case of the perpendicular crimping. With the lateral crimping, the board designer is forced to spread out the placement of tube portions to allow space for the lateral pincers to fit along the sides of the tube portion being crimped. It is theorized that this type of lateral pincer may be considerably more costly to produce, use and maintain, than the preferred arrangement of the perpendicular pincers shown in the figures.

Accordingly, either the printed circuit board is fabricated with tooling apertures in an arrangement to utilize a crimping fixture, or that the crimping fixture be custom designed to deal with a particular printed circuit assembly for multiple simultaneous crimping. For high-volume products, the latter alternative allows the invention to be used to its maximum potential.

FIGS. 9A–9D are additional simplified views, showing another preferred arrangement of the invention, when the transmission line is a coaxial cable. For the coaxial cable shown in the figures, the first (outer) conductor of the transmission line is typically embodied as a sleeve of a foil or wire braid. For the coaxial cable, there is further included an additional (center) conductor concentrically arranged within the sleeve of the first (outer) conductor, and insulated from the first (outer) conductor by heat sensitive dielectric. Of course, a diameter of the additional (center) conductor is relatively smaller than that of the first (outer) conductor. As shown, a sufficient amount of a first (outer) insulating layer of the heat sensitive dielectric is stripped so as to provide an appropriate length of the first (outer) conductor, and a sufficient amount of an additional (inner) insulating layer of the heat sensitive dielectric is stripped so as to provide an appropriate length of the additional (center) conductor.

To arrive at the arrangement as shown in FIG. 9A, the vacuum chuck employed in the automated pick-and-place equipment has already retrieved a first jacketed tube portion (and accompanying lead portions) of the preferred embodiment of the invention from a first tape and reel carrier, and furthermore has also retrieved an additional jacketed tube portion (and additional accompanying lead portions) from an additional tape and reel carrier. Careful review of the figures reveals that the first tube portion is distinguished from the additional tube portion in that the ductile conductive collar is concentrically arranged and inserted within the additional tube portion, to accept the smaller diameter of the additional (center) conductor of the transmission line (coaxial cable).

To arrive at the arrangement as shown in FIG. 9A, the automated pick-and-place equipment has already substantially oriented each of the first tube and the additional tube along a central axis with respect to one another, prior any soldering. After placement and automated reflow soldering, each of the respective lead portions are securely attached to the pads of the printed circuit board as shown in the figures. It should be noted that positioning of the couplers is accomplished without the use of a joining piece, i.e., a piece of material extending between the couplers for retaining the relative positions of the couplers during soldering.

FIGS. 9A and 9B show very simplified and very abbreviated views of the transmission line (coaxial cable) as it is threaded through the first and additional tube portions, after the soldering. Accordingly, it should be understood that an extremity of the first (outer) conductor is inserted into the first tube portion, and an extremity of the additional (center) conductor is inserted into the additional tube, after the lead portions are soldered to the circuit board, in a manner, so as to avoid exposing the heat sensitive dielectric to excessive heat of the soldering.

Figure 9C:
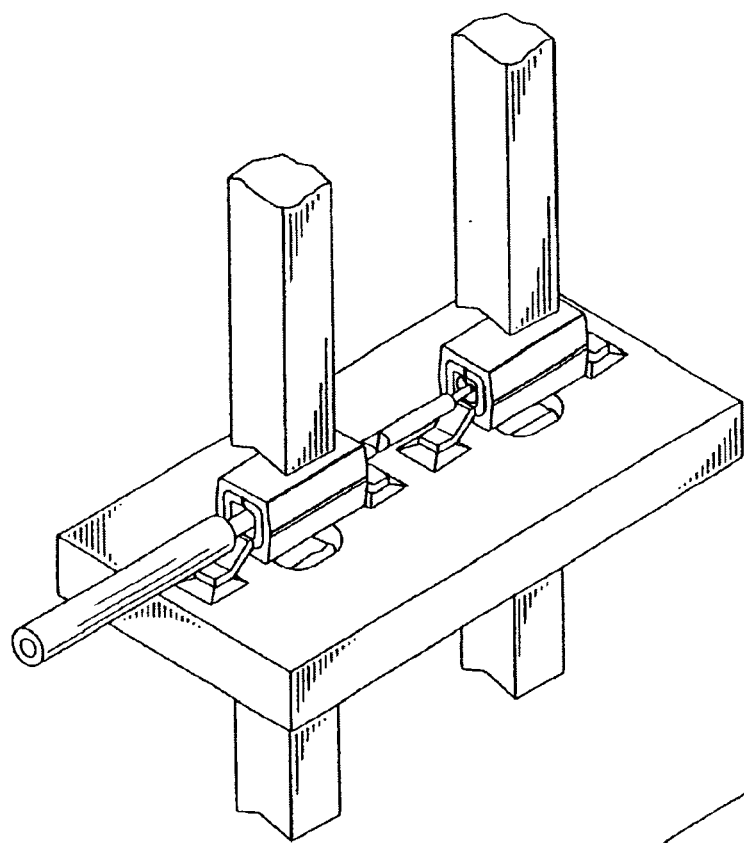
Figure 9D:
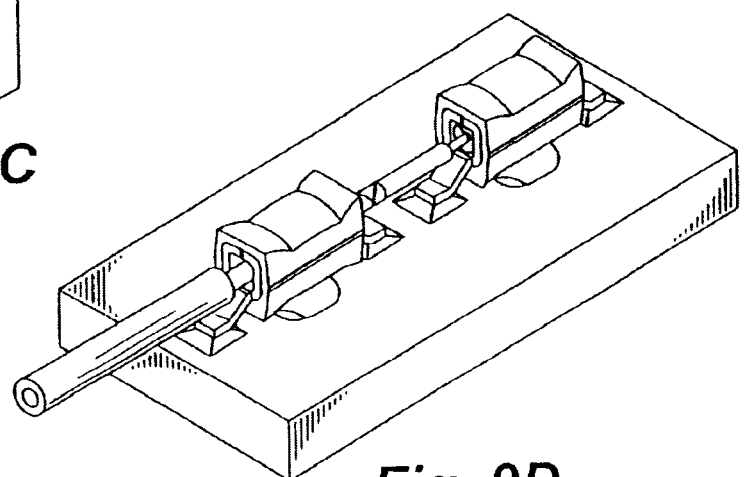

By sequential steps as illustrated in FIGS. 9C and 9D, the first ductile conductive tube portion is sufficiently crimped so as to retain the first (outer) conductor therein, and furthermore the additional ductile conductive tube portion and the ductile conductive collar are both sufficiently crimped so as retain the additional (center) conductor therein. This mechanically supports and maintains an arrangement of the lead portions, the tube portions and the transmission line, and also provides for efficient transmission of selected high frequency electrical signals between the circuit board and each of the conductors of the transmission line through the respective conductive leads and the respective conductive tubes.

FIG. 9C shows a very simplified and very abbreviated view of a first and second automated set of pincers. As shown, a first member of the first set of pincers is inserted through an aperture in the circuit board adjacent to a central region of the first tube portion (so as to impinge upon the central region of the first tube portion), while a first member of the second set of pincers is inserted through an aperture in the circuit board adjacent to a central region of the additional tube portion (so as to impinge upon the central region of the additional tube portion). Each opposing member of the first and second sets of pincers is arranged to impinge upon the respective central regions of the first and additional tube portions. As shown in FIG. 9D, the first and second set of pincers are used to crimp each of the ductile tube portions to a sufficient extent, similar to that already discussed in detail previously herein with respect to FIG. 8H.

For crimping coaxial cable, it is advantageous that the outer shield conductor of the cable be designed with the crimping in mind. Also, the circuit design embodied in the printed circuit board should be arranged and selected to withstand at least a small electrical discontinuity of the transmission line as it passes through the crimped area (which is compressed to some degree) of the outer shield conductor. Accordingly, there also an advantage to inserting a thin piece of reinforcing metal sleeve under the outer shield conductor, as part of preparation of the extremity of the coaxial cable. This reinforcing sleeve contributes little undesirable impact to the transmission line impedance. It also advantageously limits such electrical discontinuity, and absorbs some of the crimping pressure as the outer shield conductor is crimped between the reinforcing and the tube portion of the invention.

Figure 10:
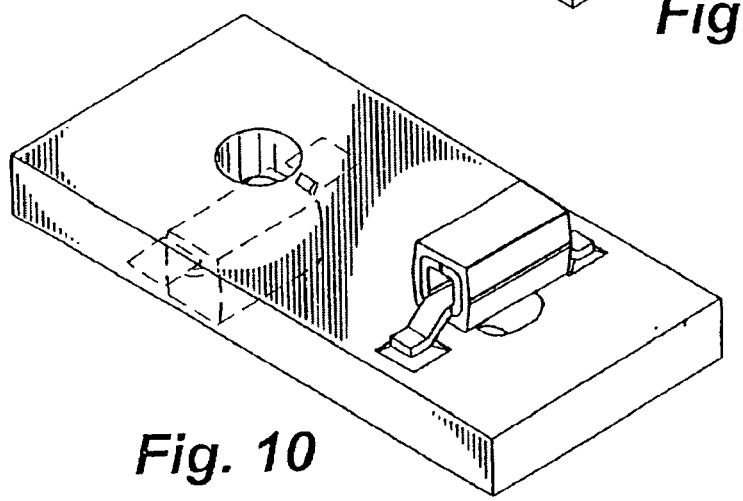
FIG. 10 is a schematic diagram depicting representative utilization of another preferred embodiment of the invention.

Referring now to FIG. 10, a preferred embodiment of the present invention which is adapted for use with SMT2 technology will now be described. As depicted in FIG. 10, a circuit board 1000 may be provided with a first aperture 1002 and a second aperture 1004. The aforementioned apertures are each adapted to cooperate with a respective surface mount component, e.g., couplers 1006 and 1008 respectively. Preferably, each aperture is adapted for inserting a crimping tool therethrough so that the crimping tool may engage the coupler associated with the aperture for crimping. Thus, as described hereinbefore, the present invention may be utilized for providing circuit boards with couplers and other components mounted on opposing sides thereof.

As discussed, the method and apparatus of the invention provide for efficient, adaptable, automated, repeatable, reliable and secure coupling of a circuit board to a transmission line that includes a heat sensitive dielectric, while maintaining high frequency signal integrity for efficient transmission. Although specific embodiments of the invention have been described and illustrated, the invention is not to be limited to the specific forms or arrangements of parts so described and illustrated, and various modifications and changes can be made without departing from the scope and spirit of the invention. For example, just as two tube portions have provided for two transmission line conductors as explicitly discussed herein, it should be implicitly understood that yet additional tube portions can be used to provide for yet additional conductors of the transmission line. Similarly, although use of tube portions have been explicitly discussed for crimped retention of conductors, it should be implicitly understood that still yet additional tube portions may be used for crimped retention of insulating dielectric; layers, for example, to provide for strain relief of the transmission line. Within the scope of the appended claims, therefore, the invention may be practiced otherwise than as specifically described and illustrated.

What is claimed is:

1. A circuit board comprising:
   a substrate having a first side, an opposing second side and a first aperture formed through the substrate and extending from the first side to the second side;
   first solder applied to the first side of the substrate adjacent to the first aperture;
   a first coupler engaging the first side of the circuit board and being secured thereto by the first solder, the first coupler having a first conductive lead portion and a first ductile conductive tube portion extending from the first conductive lead portion, at least a portion of the first coupler overlying the first aperture; and
   a first transmission line having a first conductor and heat sensitive dielectric engaged about at least a portion thereof, an extremity of the first conductor being engaged in crimped retention within the first ductile conductive tube portion such that the heat sensitive dielectric is not engaged in crimped retention by the first coupler.

2. The circuit board of claim 1, wherein the portion of the first coupler overlying the first aperture is at least a portion of the first ductile conductive tube portion.

3. The circuit board of claim 1, further comprising:
   a second aperture formed through the substrate and extending from the first side to the second side;
   a second coupler having a second conductive lead portion and a second ductile conductive tube portion extending from the second conductive lead portion, at least a portion of the second coupler overlying the second aperture;
   second solder applied to the second side of the substrate, the second coupler engaging the second side of the circuit board and being secured thereto by the second solder; and
   a second transmission line having a second conductor and heat sensitive dielectric engaged about at least a portion thereof, an extremity of the second conductor being engaged in crimped retention within the second ductile conductive tube portion.

4. The circuit board of claim 3, wherein the portion of the second coupler overlying the second aperture is at least a portion of the second ductile conductive tube portion.

5. The circuit board of claim 1, further comprising a conductive collar having an interior and an exterior, the interior receiving the first conductor, the exterior being received within the first ductile conductive tube portion.

6. The circuit board of claim 5, wherein the interior of the conductive collar is sized and shaped to prevent insertion of the heat sensitive dielectric therein.

7. The circuit board of claim 1, wherein the first coupler is oriented substantially parallel to the first side of the substrate.

8. The circuit board of claim 7, wherein the first coupler spans across the first aperture.

9. A circuit board comprising:

a substrate having a first side, an opposing second side and a first aperture formed through the substrate and extending from the first side to the second side;

a first coupler engaging the first side of the circuit board at a location adjacent the first aperture, the first coupler having a first conductive lead portion and a first ductile conductive tube portion extending from the first conductive lead portion, at least a portion of the first coupler overlying the first aperture:

a first transmission line having a first conductor, the first conductor being engaged in crimped retention within the first ductile conductive tube portion; and a conductive collar having an interior and an exterior, the interior receiving the first conductor, the exterior being received within the first ductile conductive tube portion.

10. The circuit board of claim 9, wherein:

the first transmission line includes a heat sensitive dielectric engaged about at least a portion of the first conductor; and the interior of the conductive collar is sized and shaped to prevent insertion of the heat sensitive dielectric therein.

11. A circuit board comprising:

a substrate having a first side, an opposing second side and a first aperture formed through the substrate and extending from the first side to the second side;

a first coupler engaging the first side of the circuit board at a location adjacent the first aperture, the first counter having a first conductive lead portion and a first ductile conductive tube portion extending from the first conductive lead portion, at least a portion of the first coupler overlying the first aperture; and a first transmission line having a first conductor, the first conductor being engaged in crimped retention within the first ductile conductive tube portion, wherein the first coupler is oriented substantially parallel to the first side of the substrate.

12. The circuit board of claim 7, wherein the first transmission line includes a heat sensitive dielectric engaged about at least a portion of the first conductor.

13. The circuit board of claim 11, further comprising:

solder engaging the first side of the substrate and securing the first coupler to the first side of the substrate.

14. The circuit board of claim 11, wherein the portion of the first coupler overlying the first aperture is at least a portion of the first ductile conductive tube portion.

15. The circuit board of claim 11, wherein an extremity of the first conductor is inserted into the first ductile conductive tube portion and crimped therein for providing crimped retention of the first conductor.

16. The circuit board of claim 11, wherein the first ductile conductive tube portion exhibits a continuous exterior periphery.

17. The circuit board of claim 11, wherein the first coupler spans across the first aperture.

18. A circuit board of comprising:

a substrate having a first side, an opposing second side and a first aperture formed through the substrate and extending from the first side to the second side;

a first coupler engaging the first side of the circuit board at a location adjacent the first aperture, the first coupler having a first conductive lead portion and a first ductile conductive tube portion extending from the first conductive lead portion, at least a portion of the first coupler overlying the first aperture; and a first transmission line having a first conductor, the first conductor being engaged in crimped retention within the first ductile conductive tube portion, wherein the first transmission line includes a heat sensitive dielectric engaged about at least a portion of the first conductor, and wherein the heat sensitive dielectric is not engaged in crimped retention by the first coupler.

* * * * *

UNITED STATES PATENT AND TRADEMARK OFFICE
CERTIFICATE OF CORRECTION

PATENT NO. : 6,909,051 B2
DATED : June 21, 2005
INVENTOR(S) : Noble

It is certified that error appears in the above-identified patent and that said Letters Patent is hereby corrected as shown below:

Column 13,
Line 13, after "aperture" delete ":" and insert -- ; --, therefor.
Line 32, delete "counter" and insert -- coupler --, therefor.

Column 14,
Line 3, delete "claim 7" and insert -- claim 11 --, therefor.
Line 20, after "board" delete "of".

Signed and Sealed this

Fifteenth Day of November, 2005

JON W. DUDAS
*Director of the United States Patent and Trademark Office*